US012546003B2

(12) United States Patent
Dharmapura Sathyanarayanamurthy et al.

(10) Patent No.: US 12,546,003 B2
(45) **Date of Patent: *Feb. 10, 2026**

(54) ATOMIC LAYER DEPOSITION PART COATING CHAMBER

(71) Applicant: Applied Materials, Inc., Santa Clara, CA (US)

(72) Inventors: Sriharsha Dharmapura Sathyanarayanamurthy, Bengaluru (IN); Hanish Kumar Panavalappil Kumarankutty, Bangalore (IN); Kirubanandan Naina Shanmugam, Bangalore (IN); Manojkumar Shanmugasundaram, Bangalore (IN); Sriharish Srinivasan, Bangalore (IN); Vinay Konana Basavaraj, Bangalore (IN)

(73) Assignee: Applied Materials Inc., Santa Clara, CA (US)

( * ) Notice: Subject to any disclaimer, the term of this patent is extended or adjusted under 35 U.S.C. 154(b) by 660 days.

This patent is subject to a terminal disclaimer.

(21) Appl. No.: 17/946,842

(22) Filed: Sep. 16, 2022

(65) Prior Publication Data

US 2024/0093367 A1 Mar. 21, 2024

(51) Int. Cl.
*C23C 16/455* (2006.01)

(52) U.S. Cl.
CPC .... *C23C 16/4557* (2013.01); *C23C 16/45544* (2013.01); *C23C 16/45565* (2013.01)

(58) Field of Classification Search
CPC .......... C23C 16/4557; C23C 16/45544; C23C 16/45565; C23C 16/46; C23C 16/4412
See application file for complete search history.

(56) References Cited

U.S. PATENT DOCUMENTS 3,854,443 A * 12/1974 Baerg .................... C23C 16/455 118/724
7,008,484 B2 * 3/2006 Yim .................. H01J 37/32082 156/345.33

(Continued)

FOREIGN PATENT DOCUMENTS

KR 10-192 9473 B1 3/2014
KR 102189785 B1 * 12/2020

OTHER PUBLICATIONS

International Search Report for PCT/US2023/033005, dated Jan. 11, 2024.

(Continued)

*Primary Examiner* — Jeffrie R Lund
(74) *Attorney, Agent, or Firm* — Moser Taboada

(57) ABSTRACT

Embodiments of part coating reactors are provided herein. In some embodiments, a part coating reactor includes a lid assembly, comprising: a body that includes a central region and a peripheral region, wherein the body includes a central opening in the central region, a first annular heater groove disposed radially outward of the central opening, and a second annular heater groove disposed radially outward of the first annular heater groove, wherein the peripheral region includes a plurality of vertical slots that extend from an upper surface of the body, and wherein a lower surface of the body includes an annular alignment groove; and a blocker plate including a substantially flat plate having a plurality of holes disposed therethrough and an annular wall extending above and below the flat plate, wherein an upper surface of the annular wall is disposed in the annular alignment groove of the body.

20 Claims, 6 Drawing Sheets

(56) References Cited

U.S. PATENT DOCUMENTS

| | | | | |
|---|---|---|---|---|
| 8,083,855 | B2 | 12/2011 | Dhindsa et al. | |
| 8,444,926 | B2 | 5/2013 | Fodor et al. | |
| 9,466,506 | B2 * | 10/2016 | Masuda | H01J 37/3244 |
| 10,832,903 | B2 | 11/2020 | Pettinger et al. | |
| 12,074,010 | B2 * | 8/2024 | Rice | C23C 16/45574 |
| 2007/0090516 | A1 * | 4/2007 | White | H01L 21/67109 257/704 |
| 2009/0188625 | A1 * | 7/2009 | Carducci | H01J 37/32467 156/345.1 |
| 2010/0294199 | A1 * | 11/2010 | Tran | H01L 21/68785 118/723 R |
| 2014/0291286 | A1 * | 10/2014 | Okayama | C23C 16/45519 239/548 |
| 2015/0232992 | A1 * | 8/2015 | Kim | H01L 21/02348 427/553 |
| 2016/0032451 | A1 * | 2/2016 | Kurita | H01J 37/32862 156/345.35 |
| 2019/0078210 | A1 | 3/2019 | Gungor et al. | |
| 2019/0119816 | A1 | 4/2019 | Zhang et al. | |
| 2019/0185999 | A1 * | 6/2019 | Shanbhag | C23C 16/45536 |
| 2019/0226088 | A1 * | 7/2019 | Zhang | C23C 16/4557 |
| 2019/0304756 | A1 * | 10/2019 | Kalita | H01J 37/32495 |
| 2020/0013589 | A1 * | 1/2020 | Balaraman | C23C 16/34 |
| 2020/0098549 | A1 * | 3/2020 | Park | H01J 37/3244 |
| 2021/0249239 | A1 * | 8/2021 | Apurva | C23C 16/45591 |
| 2023/0005765 | A1 * | 1/2023 | Nguyen | H01J 37/32357 |
| 2023/0073150 | A1 * | 3/2023 | Hiremath | H01L 21/68785 |
| 2023/0074149 | A1 | 3/2023 | Rice et al. | |
| 2024/0093367 | A1 * | 3/2024 | Dharmapura Sathyanarayanamurthy | C23C 16/45565 |

OTHER PUBLICATIONS

U.S. Appl. No. 17/470,294, filed Sep. 9, 2021.
U.S. Appl. No. 17/470,418, filed Sep. 9, 2021.

* cited by examiner

ATOMIC LAYER DEPOSITION PART COATING CHAMBER

FIELD

Embodiments of the present disclosure generally relate to substrate processing equipment.

BACKGROUND

Many microelectronic device fabrication processes are performed in reactors having coated parts or components. Such coated components can provide one or more benefits such as, for example, reduced contamination of substrates disposed in the reactor during processing, improved process results, improved chamber uptime before requiring maintenance, or the like. The inventors have observed that cost of coating reactor parts, such as gas distribution faceplates, showerheads, or the like, can be very high. For example, conventionally, such parts are coated in a batch reactor that can, for example, hold about 2 to 8 faceplates per batch. However, the coating process can take between about 3-8 days per batch, depending upon the particular part configuration and the desired coating to be applied. Thus, even with the benefit of coating multiple parts at once, the per unit cost for such coated parts remains high.

Therefore, the inventors have provided improved apparatus and techniques for coating processing reactor component parts.

SUMMARY

Embodiments of part coating reactors are provided herein. In some embodiments, a part coating reactor includes: a lid assembly comprising: a body that includes a central region and a peripheral region, wherein the body includes a central opening in the central region, a first annular heater groove disposed radially outward of the central opening, and a second annular heater groove disposed radially outward of the first annular heater groove, wherein the peripheral region includes a plurality of vertical slots that extend from an upper surface of the body, wherein the body includes an annular gas supply groove that extends from the upper surface of the body, an annular purge gas groove that extends from a floor of the annular gas supply groove, and a plurality of gas supply openings extending from the purge gas groove to a lower surface of the body, and wherein a lower surface of the body includes an annular alignment groove; a first heater ring disposed in the first annular heater groove and having one or more heating elements disposed therein; and a second heater ring disposed in the second annular heater groove and having one or more heating elements disposed therein; and a blocker plate including a substantially flat plate having a plurality of holes disposed therethrough and an annular wall extending above and below the flat plate, wherein an upper surface of the annular wall is disposed in the annular alignment groove of the body.

In some embodiments, a part coating reactor includes: a lid assembly having a body that includes a central region and a peripheral region, wherein the body includes a central opening in the central region, a first heater ring disposed in a first annular heater groove disposed radially outward of the central opening, and a second heater ring disposed in a second annular heater groove disposed radially outward of the first annular heater groove, wherein the peripheral region includes a plurality of vertical slots that extend from an upper surface of the body, wherein the body includes an annular gas supply groove that extends from the upper surface of the body, an annular purge gas groove that extends from a floor of the annular gas supply groove, and a plurality of gas supply openings extending from the purge gas groove to a lower surface of the body; a cap disposed in the annular gas supply groove to define a first plenum in the annular gas supply groove, wherein the cap includes one or more gas inlet holes; a bottom lid coupled to the lid assembly to enclose and define an interior volume of the part coating reactor; a blocker plate disposed in the interior volume adjacent the lid assembly and including a substantially flat plate having a plurality of holes disposed therethrough and an annular wall extending above and below the flat plate, wherein the blocker plate and the lid assembly define a mixing plenum therebetween; and a liner disposed about the blocker plate and coupled to the body.

In some embodiments, a process chamber includes: a lid assembly having a body that includes a central region and a peripheral region, wherein the body includes a central opening in the central region, a first heater ring disposed in a first annular heater groove disposed radially outward of the central opening, and a second heater ring disposed in a second annular heater groove disposed radially outward of the first annular heater groove, wherein the peripheral region includes a plurality of vertical slots that extend from an upper surface of the body, wherein the body includes an annular gas supply groove that extends from the upper surface of the body, an annular purge gas groove that extends from a floor of the annular gas supply groove, and a plurality of gas supply openings extending from the purge gas groove to a lower surface of the body; a cap disposed in the annular gas supply groove to cover the annular purge gas groove, wherein the cap includes one or more gas inlet holes; a cover plate disposed atop the first heater ring and the second heater ring; a bottom lid coupled to the lid assembly to enclose and define an interior volume of the process chamber; a blocker plate disposed in the interior volume adjacent the lid assembly and including a substantially flat plate having a plurality of holes disposed therethrough and an annular wall extending above and below the flat plate, wherein the blocker plate and the lid assembly define a mixing plenum therebetween; a liner disposed about the blocker plate and coupled to the body, the liner having a plurality slots; and a pedestal heater disposed in the interior volume.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
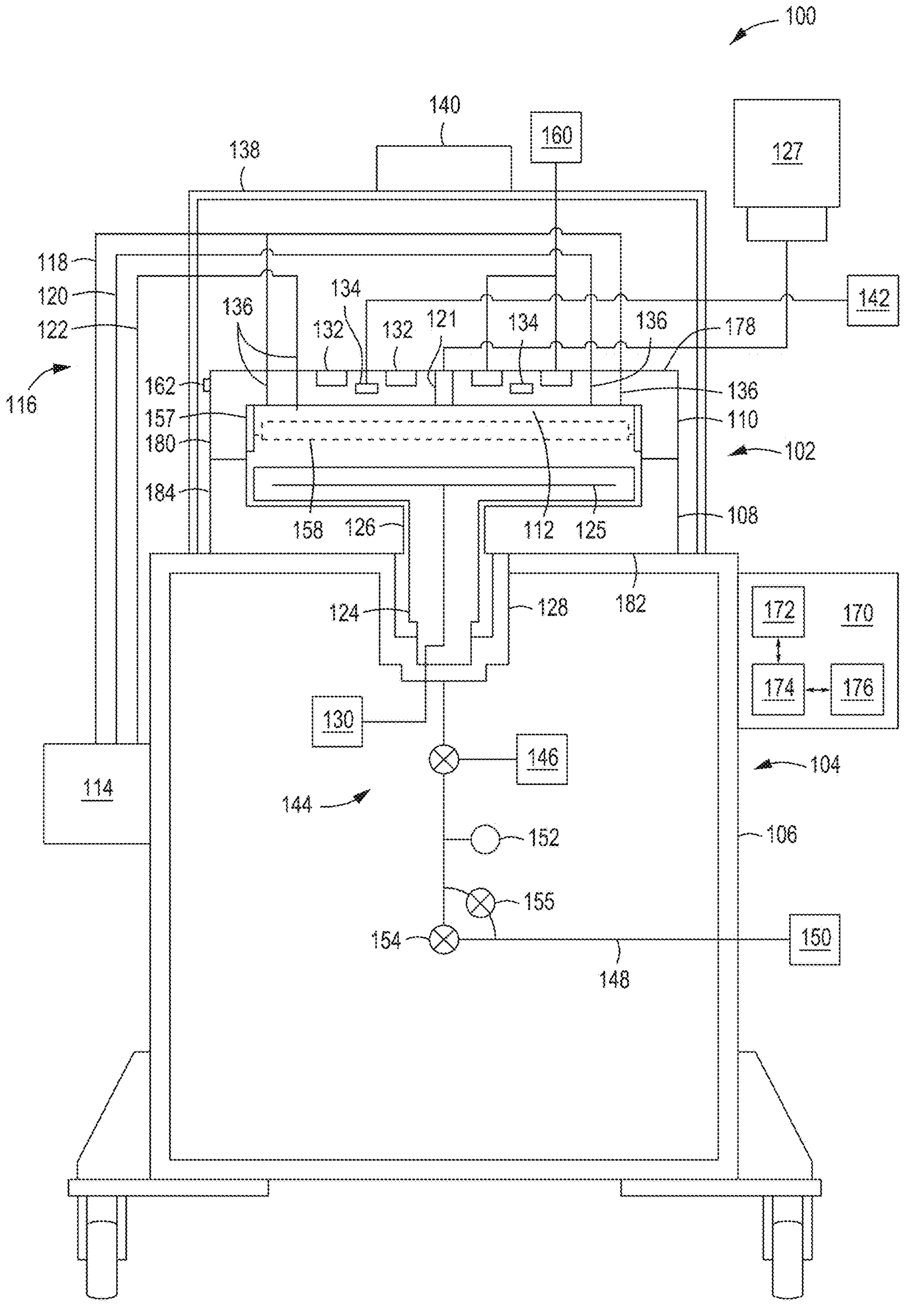
FIG. 1 is a schematic side view of a part coating system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a part coating reactor are provided herein. In some embodiments, the part coating reactor is configured for deposition of materials on parts using atomic layer deposition (ALD) processes. The methods and apparatus of the present disclosure advantageously reduce cycle time and cost to produce coated parts by an order of magnitude.

FIG. 1 is a schematic side view of a part coating system 100 in accordance with at least some embodiments of the present disclosure. As depicted in FIG. 1, a part coating system 100 is shown having a part coating reactor 102 disposed on a support 104. The support 104 is illustratively shown as including a frame assembly 106. The frame assembly 106 is depicted having wheels, but alternatively or additionally, the frame assembly 106 can include leveling feet, stabilizing brackets, or other elements to support the part coating reactor 102. In some embodiments, the frame assembly 106 may be omitted and the part coating reactor 102 can be disposed on some other type of support 104, such as by resting or mounting on another component such as, for example, a base, a transfer chamber of a cluster tool, a parts handling system for feeding and retrieving parts to/from the part coating reactor 102, or the like.

A cover 138 may be provided to enclose the part coating reactor 102. The cover 138 may be disposed on the support 104 or otherwise be coupled to the part coating reactor 102. The cover 138 can include a plurality of openings to facilitate airflow therethrough to cool the part coating reactor 102. A fan 140 may be provided to enhance air cooling of the exterior of the part coating reactor 102.

The part coating reactor 102 generally includes a lower body 108 and a lid assembly 110 that together define and enclose an interior volume 112. The interior volume may be small, such as about 1 to about 1.5 liters. Each of the lower body 108 and the lid assembly 110 may include a cavity formed in facing surfaces of the components that together define the interior volume 112 when the lower body 108 and the lid assembly 110 are assembled together. For example, the lower body 108 may include a bottom plate 182 and a sidewall 184 extending upwardly from the bottom plate 182 and partially enclosing the interior volume 112. Similarly, the lid assembly 110 may include a top plate 178 and a sidewall 180 extending downwardly from the top plate 178 and partially enclosing the interior volume 112. In some embodiments, each of the sidewalls 180, 184 may have the same or substantially the same dimension defining the interior volume 112 (e.g., diameter for circular chamber configurations). In some embodiments a dimension across the interior volume 112 within the sidewalls 180, 184 (e.g., an inner diameter), is about 14 to about 20 inches. In some embodiments, the lid assembly 110 and the lower body 108 may be coupled together, for example, by clamping, bolting, screwing, or the like. A lift system (not shown) may be provided to lift the lid assembly 110 to facilitate insertion and removal of a workpiece to be coated or for other maintenance or actions that require access to the interior volume 112. The lid assembly 110 and the lower body can be made from any suitable process compatible materials, such as aluminum, stainless steel, or the like.

Figure 2:
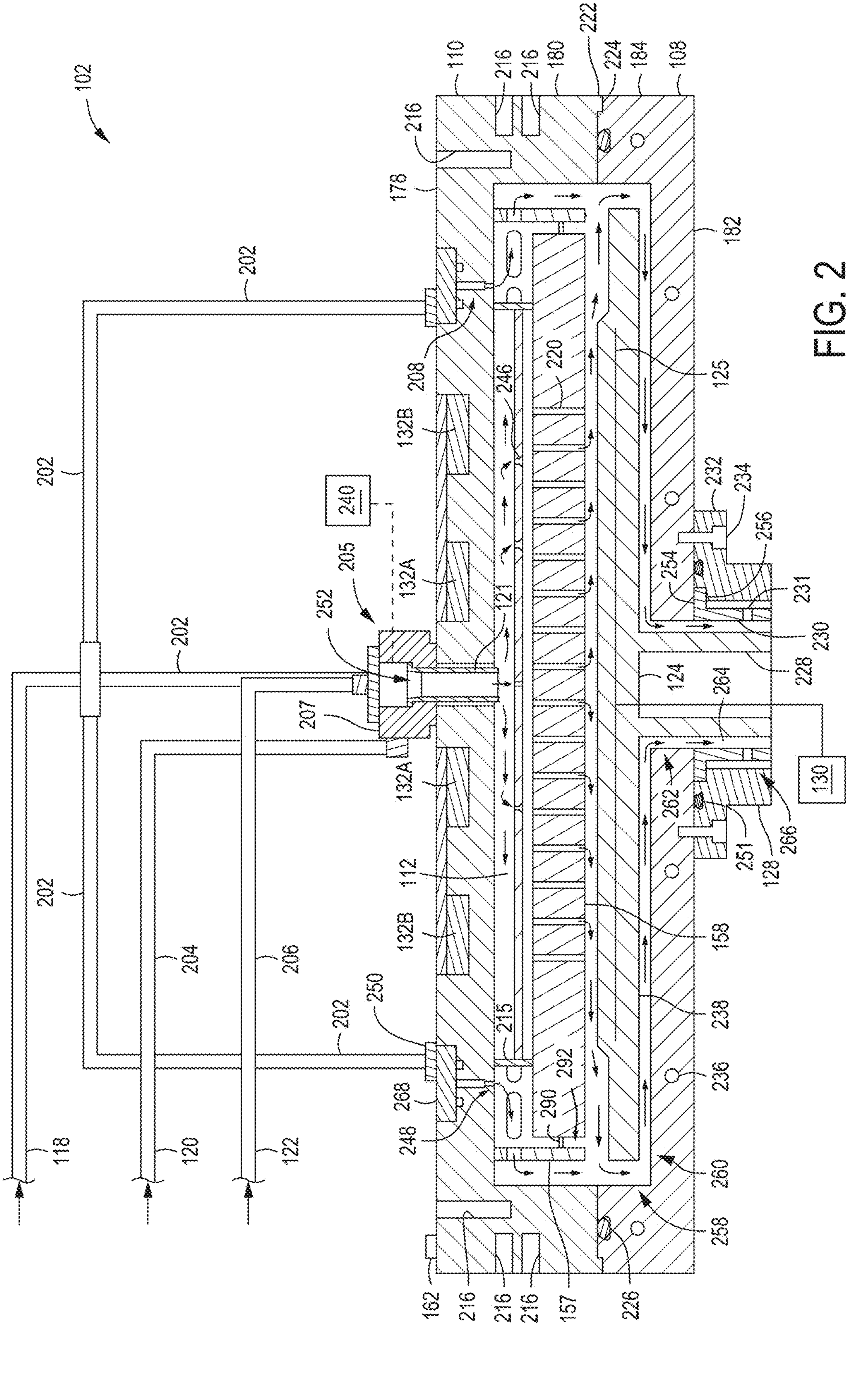
FIG. 2 is a schematic cross-sectional side view of a portion of a part coating reactor in accordance with at least some embodiments of the present disclosure.

The lid assembly 110 includes one or more heaters 132. The one or more heaters 132 may be coupled to a heater power source 160. In some embodiments, the one or more heaters 132 comprise ring-shaped heaters disposed in annular channels in the upper surface of the lid assembly 110 (e.g., in a top surface of the top plate 178). A thermostat 162 may be disposed in or coupled to the lid assembly 110 to monitor the temperature of the lid assembly 110 and, in some embodiments, to facilitate feedback control of the temperature during use. The thermostat 162 may be provided in any suitable location for monitoring the temperature of the lid assembly 110, such as on a side of the lid assembly 110 (as depicted in FIG. 1), or on a top surface of the lid assembly 110 (as depicted in FIG. 2).

In some embodiments, one or more coolant channels 134 may be provided in at least one of the lower body 108 or the lid assembly 110 to flow a heat transfer medium therethrough. For example, a coolant source 142 can be coupled to the one or more coolant channels 134 to circulate a coolant therethrough. In some embodiments, the one or more coolant channels 134 are disposed only in the lower body 108 and not in the lid assembly 110. In some embodiments, the coolant source 142 and coolant channels 134 are configured to maintain a temperature of the lid assembly 110 at about 50 to about 75 degrees Celsius.

In some embodiments, the lid assembly 110 includes a plurality of gas passages 136 disposed therethrough to facilitate providing one or more gases to the interior volume 112 of the part coating reactor 102. A gas source 114 is fluidly coupled to the interior volume 112 via a plurality of conduits 116 coupled to the plurality of gas passages 136 to provide process gases to the interior volume 112 during operation, such as an ALD operation to coat a workpiece (or part) disposed in the interior volume 112, as discussed below. For example, the gas source may include precursor ampoules, one or more inert gases, or purge gases, as well as high speed pulsing valves, purge valves, or the like, to provide deposition gases, carrier gases, purge gases, and the like, for performing an ALD process to coat the workpiece. For example, as shown in FIG. 1, a first conduit 118, a second conduit 120, and a third conduit 122 can be provided to supply three different gases to the interior volume 112, such as for example, a first precursor, a second precursor, and an inert gas. The first conduit 118, the second conduit 120, and the third conduit 122 can be coupled to the interior volume 112 through the lid assembly 110, for example, through the plurality of gas passages 136 and/or through a central opening 121 (discussed in more detail below). The gas source may be a purge gas source.

In one non-limiting example, the coating to be formed can be an aluminum oxide ($Al_2O_3$) coating. In such embodiments, for example, the gas source can be configured to provide deposition gases (e.g., precursor gases) including trimethylaluminum (TMA) and water ($H_2O$) along with inert gases, such as nitrogen ($N_2$) or a noble gas, for example, argon (Ar), or the like. Other ALD deposited films can similarly be obtained, such as but not limited to, films with basic formulas such as MOx, MOxFy, MFx, SiOx, SiCx, SiN, M1M2Ox, or the like, wherein M is a metal, M1 is a first metal, and M2 is a second metal different than the first. Such films can be deposited using suitable ALD precursors and deposition processes within the apparatus described herein.

In some embodiments, the part coating reactor 102 is configured to deliver the one or more process gases in a distributed manner. For example, in some embodiments, the part coating reactor 102 is configured to deliver the one or more process gases into a plurality of zones of the interior volume 112. For example, the lid assembly 110 can include a plurality of fluidly independent plenums each coupled to the gas source 114. Each of the fluidly independent plenums are configured to provide one or more process gases to a particular zone of the interior volume 112, wherein at least some of the particular zones are different from each other. The fluidly independent plenums advantageously provide separation of gases to prevent undesired reaction and/or deposition within the conduits or lid assembly 110.

In some embodiments, a remote plasma source (RPS) 127 can be coupled to the interior volume 112, for example, via the central opening 121 in the lid assembly 110 to facilitate cleaning of the part coating reactor 102 when desired. Alternatively, or in combination, the gas source 114 can be coupled to the interior volume 112 (e.g., via the first conduit 118, the second conduit 120, the third conduit 122, or the central opening 121). For example, as shown in FIG. 2, the central opening 121 can be coupled to a gas source 240. The gas source 240 can include one or more of the gas source 114 or the RPS 127.

In some embodiments, a workpiece 158 is coupled to the lid assembly 110. In some embodiments, the workpiece 158 partially defines a processing volume portion of the interior volume 112. For example, in some embodiments, the workpiece 158 can be a showerhead, gas distribution plate (or faceplate), or the like. In some embodiments, the workpiece 158 includes a plurality of gas distribution holes 220 disposed therethrough (e.g., to a processing volume of a chamber having the showerhead installed therein). The showerhead (e.g., workpiece) may include a plurality of openings through the bottom plate, radially outward of the peripheral lip to facilitate coupling the workpiece to the lid assembly 110.

In some embodiments, the part coating reactor 102 is configured to coat a workpiece of a given size. For example, where the workpiece 158 is a showerhead, the showerhead can be configured for use in a process chamber configured for processing a substrate of a predetermined size. For example, the workpiece 158 can be a showerhead configured for processing a semiconductor wafer, such as a 150 mm, 200 mm, 300 mm, or the like diameter semiconductor wafer, or a rectangular substrate such as for solar, display, or other applications. In some embodiments, the workpiece (e.g., part to be coated) can be a substrate support pedestal configured to support a planar substrate, such as a pedestal heater 124 described below. For example, the pedestal heater 124 can be coupled to a lower body 108 of the part coating reactor 102 such that a support surface of the substrate support pedestal is disposed in the interior volume 112 opposite the lid assembly 110. In such embodiments, the process can be performed without fastening any workpiece 158 (such as a showerhead) to the lid assembly 110.

In some embodiments, a liner 157 is provided to surround the workpiece or part to be coated (e.g., workpiece 158) to protect the lid assembly 110. The liner 157 can have any suitable shape to surround the workpiece 158 and protect the inner sidewalls of the lid assembly 110 (e.g., the outer periphery of the interior volume adjacent to the lid assembly). For example, the general shape of the inner periphery of the liner can be configured to surround a workpiece having a given shape or size in order to surround the workpiece and fill the air gaps or space between the workpiece and the sidewalls of the part coating reactor 102, for example the sidewalls of the lid assembly 110. The liner 157 may be coupled to the workpiece 158 via fasteners 290 to hold the workpiece 158. A gap 292 may be maintained between an inner surface of the liner 157 and an outer surface of the workpiece 158 for process gases to flow and to coat sides of the workpiece 158. In some embodiments, the gap 292 is about 1.5 to about 2.0 mm.

The lower body 108 is sized and configured to receive the pedestal heater 124. For example, the lower body 108 may include an opening 126 formed through the bottom plate 182 to receive a shaft (e.g., shaft 228 depicted in FIG. 2) of the pedestal heater 124. A pedestal hub 128 can be coupled to the bottom plate 182 to surround and enclose the shaft of the pedestal heater 124. In some embodiments, the shaft of the pedestal heater 124 may be coupled to and supported by the pedestal hub 128 such that a bottom surface of the pedestal heater 124 is disposed above and opposing top surface of the bottom plate 182 of the lower body 108. The workpiece 158 may be coupled to the lid assembly 110 such that a lower surface of the workpiece (such as the bottom plate of a showerhead) is spaced about 1 to about 5 mm, such as about 4 mm apart from a support surface of the pedestal heater 124.

An exhaust assembly 144 of the part coating reactor 102 is fluidly coupled to the interior volume 112 through the pedestal hub 128. The exhaust assembly 144 includes a throttle valve 146 disposed in line along a conduit 148 coupling a pump 150 to the interior volume 112. The throttle valve 146 facilitate control of the pressure within the interior volume 112. A pressure gauge 152 may also be coupled to the conduit 148 to monitor a pressure in the conduit 148 (and, by relation, the pressure within the interior volume). In some embodiments, additional valves, for example such as an isolation valve 154, a bypass valve 155, or the like, may be provided to facilitate isolating and/or disconnecting the part coating reactor 102 from the conduit 148 and pump 150, for example, for maintenance.

The part coating system 100 may also include a controller 170 coupled to the part coating reactor 102. The controller 170 controls the operation of the part coating reactor 102 using a direct control or alternatively, by controlling the computers (or controllers) associated with the part coating reactor 102. In operation, the controller 170 enables data collection and feedback to optimize performance of the part coating reactor 102. The controller 170 generally includes a central processing unit (CPU) 172, a memory 174, and support circuits 176. The CPU 172 may be any form of a general-purpose computer processor that can be used in an industrial setting. The support circuits 176 are conventionally coupled to the CPU 172 and may comprise a cache, clock circuits, input/output subsystems, power supplies, and the like. Software routines, such as methods as described herein may be stored in the memory 174 and, when executed by the CPU 172, transform the CPU 172 into a specific purpose computer (controller 170). The software routines may also be stored and/or executed by a second controller (not shown) that is located remotely from the part coating reactor 102.

The memory 174 is in the form of computer-readable storage media that contains instructions, when executed by the CPU 172, to facilitate the operation of the part coating reactor 102. The instructions in the memory 174 are in the form of a program product such as a program that implements the apparatus of the present disclosure. The program code may conform to any one of a number of different programming languages. In one example, the disclosure may be implemented as a program product stored on a computer-readable storage media for use with a computer system. The program(s) of the program product define functions of the aspects. Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the part coating reactor 102 described herein, are aspects of the present disclosure.

A pedestal heater power supply 130 is coupled to a heater electrode 125 disposed in the pedestal heater 124, for example, through the pedestal hub 128, to power the pedestal heater 124 during use. The heater electrode 125 can be configured in one or a plurality of zones, such as two zones. In some embodiments, the pedestal heater 124 is configured to heat up to about 600 degrees Celsius (e.g., in a range of about 100 to about 600, or about 200 to about 500 degrees Celsius) at a rate of up to about 5 degrees Celsius per minute.

Additional details of a part coating reactor in accordance with at least some embodiments of the disclosure are shown in FIG. 2, which is a schematic cross-sectional side view of a portion of a part coating reactor, such as the part coating reactor 102. As depicted in FIG. 2, the lid assembly 110 is coupled to the lower body 108 to at least partially define the interior volume 112. In some embodiments, a seal may be provided at the interface between the lid assembly 110 and the lower body 108. For example, a groove 226 may be provided in one or more of the lid assembly 110 or the lower body 108 to receive a gasket, for example an O-ring, to facilitate maintaining a seal between the lid assembly 110 and the lower body 108 when assembled. In some embodiments, one or more alignment features may be provided to facilitate the alignment and interconnection of the lid assembly 110 and the lower body 108. For example, a protrusion or lip 222 may be disposed around a peripheral edge of one of the lid assembly 110 or the lower body 108. A mating recess 224 may be provided in the other of the lid assembly 110 or the lower body 108 to receive and interface with the lip 222. In the embodiment depicted in FIG. 2, the lip 222 is shown protruding downward from the lid assembly 110 and the mating recess 224 is shown formed in the peripheral edge of the lower body 108.

In the embodiment depicted in FIG. 2, the one or more heaters 132 comprise, for example, a first heater ring 132A and a second heater ring 132B. In some embodiments, one or more thermal conduction chokes may be provided in the lid assembly 110 to facilitate reduction of heat transfer away from the upper central portion of the lid assembly, above the interior volume 112. For example, a plurality of slots 216 may be formed in the lid assembly 110 to interfere with conductive heat transfer through the lid assembly 110. In some embodiments, the plurality of slots 216 comprise elongate slots. The plurality of slots 216 can be formed in either or both of the upper surface or side surfaces of the lid assembly 110.

Figure 3:
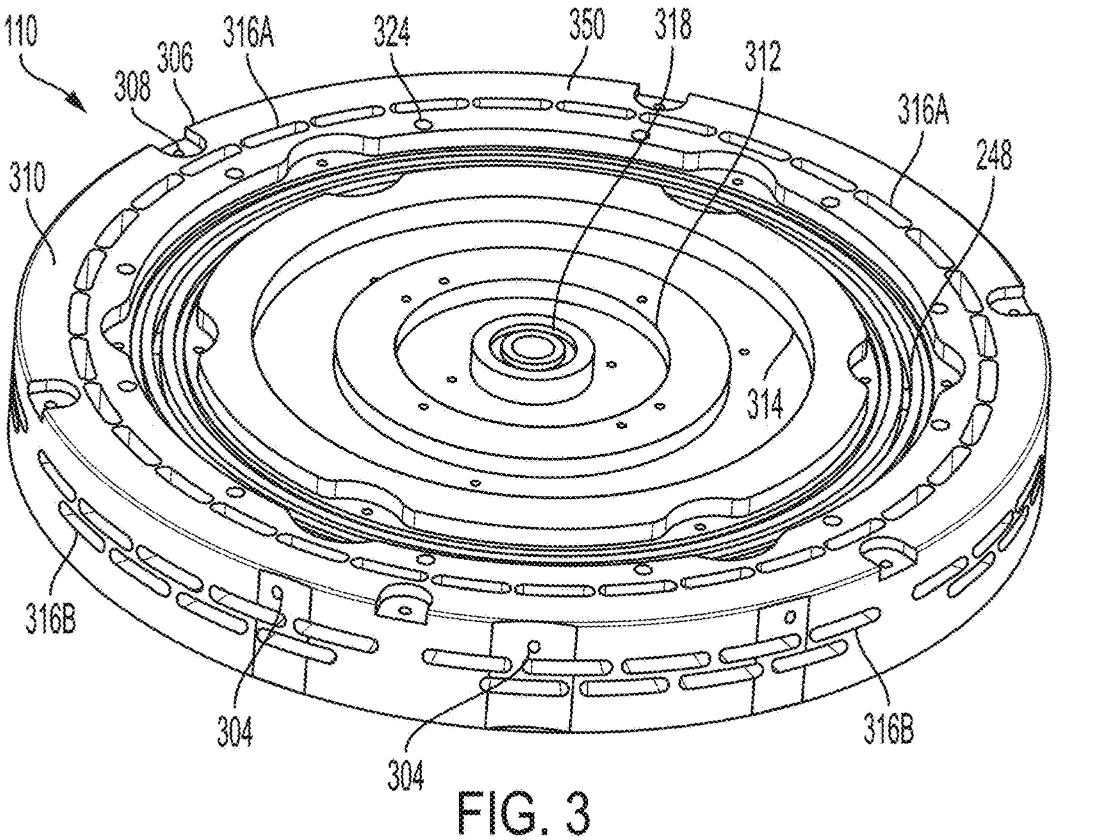
FIG. 3 is a cross-sectional view of a portion of a lid assembly in accordance with at least some embodiments of the present disclosure.

In the embodiment depicted in FIG. 2, and as shown more clearly in FIG. 3, a plurality of slots 216 (a plurality of vertical slots 316A in FIG. 3) may be formed in the top surface of the lid assembly 110. The plurality of vertical slots 316A may be arranged, for example, along a circle proximate an outer peripheral edge of the lid assembly 110 and radially outward of the interior volume 112. In some embodiments, the plurality of slots 216 may be elongate slots having major axes aligned or substantially aligned with the circle along which they are disposed (e.g., tangentially aligned with the circle, for example, at the center of the elongate slot).

In the embodiment depicted in FIG. 2, and as shown more clearly in FIG. 3, a plurality of slots 216 (plurality of horizontal slots 316B in FIG. 3) may be formed in the side surface of the lid assembly 110. The plurality of horizontal slots 316B may be arranged, for example, along one or more circular rows (two circular rows shown in the Figures) along the outer peripheral edge of the lid assembly 110. In embodiments where more than one circular row of recesses are provided, the recesses in each row may be staggered or overlap to reduce the pathways for conductive heat transfer from the top surface of the lid assembly 110 down the side surface of the lid assembly 110 (e.g., to form a tortuous path for thermal conduction). In some embodiments, the lid assembly 110 includes a plurality of horizontal slots 316B arranged along two or more vertical rows and extending from an outer sidewall of the body to a location radially outward of the plurality of vertical slots 316A. In some embodiments, the plurality of horizontal slots 316B may be elongate slots having major axes aligned or substantially aligned with the circular row along which they are disposed. In some embodiments, the plurality of horizontal slots 316B extend from an outer sidewall of the body to a location radially outward of the plurality of vertical slots 316A.

The foregoing description of various components of the parts coating reactor 102 is exemplary and other variations are possible within the scope of the present disclosure. In some embodiments, the part coating reactor 102 is configured to deliver the one or more process gases into an outer zone and a central zone. For example, a plurality of fluidly independent plenums of the lid assembly 110 may be coupled to the gas source 114 such that reactive gases can be provided to a central plenum 252 via the central opening 121 of the lid assembly 110 and one or more inert gases can be provided to an outer annular plenum 208. The outer annular plenum 208 facilitates providing one or more gases to a peripheral region of the interior volume 112, and a peripheral region of the workpiece 158 to be coated. In some embodiments, for example, an inert gas may be provided to the outer annular plenum 208 to prevent deposition on the peripheral portion of the workpiece and/or on peripheral portions of the interior volume 112.

A plurality of gas supply openings 248 may be provided in the outer annular plenum 208, for example along a bottom surface of the outer annular plenum 208, to fluidly couple the outer annular plenum 208 to the interior volume 112. The plurality of gas supply openings 248 can be sized and arranged to provide a suitable gas flow into the interior volume 112. In some embodiments, the plurality of gas supply openings 248 can be equidistantly or substantially equidistantly spaced along the outer annular plenum 208. In some embodiments, the plurality of gas supply openings 248 can be arranged into sets of holes, with each set of holes equidistantly or substantially equidistantly spaced along the plenum.

In some embodiments, the outer annular plenum 208 may be coupled to the gas source 114, or gas source 240, via the first conduit 118. The first conduit 118 may be coupled to outer annular plenum 208 via one or more first legs 202. The second conduit 120 may be coupled to the central plenum 252 via one or more second legs 204. The third conduit 122 may be coupled to the central plenum 252 via one or more third legs 206. Each of the one or more legs 202, 204, 206, are coupled to the respective plenums via respective inlets along the plenums. In some embodiments, the first conduit 118 may be coupled to the outer annular plenum 208 in a plurality of locations along the outer annular plenum. The plurality of locations can be two or more locations, three or more locations, four or more locations, or the like. For example, the plurality of locations can be six locations. The first conduit 118 may provide an inert gas, such as nitrogen ($N_2$) or a noble gas, for example, argon (Ar), or the like.

In some embodiments, the first conduit 118 is coupled to the outer annular plenum 208 in an azimuthally symmetric manner. The first conduit 118 may be coupled to the outer annular plenum 208 via one or more fittings 250 disposed on the end of each of the one or more first legs 202. A cap 268 may be disposed atop the outer annular plenum 208 to define the outer annular plenum 208 and may be coupled to the top plate 178 via a plurality of fasteners (e.g., screws or the like). The one or more fittings 250 may be coupled to the cap 268.

The central plenum 252 facilitates providing one or more gases, such as different deposition or precursor gases for an ALD process, to a radially inner portion of the interior volume (e.g., a central portion) proximate regions of the workpiece that are desired to be coated. In some embodiments, the central plenum 252 may include a nozzle assembly 205 to facilitate distribution of the process gases to the interior volume 112. The nozzle assembly 205 can include a body 207 having an interior opening into which a nozzle can be inserted and retained.

A blocker plate 215 is disposed in the interior volume 112 adjacent the lid assembly 110 and between the central plenum 252 and the workpiece 158. The blocker plate 215 includes a plurality of holes 246 to distribute process gases to the workpiece 158 and is described in more detail below with respect to FIG. 8. The blocker plate 215 and the lid assembly 110 define a mixing plenum therebetween. The liner 157 is disposed about the blocker plate 215 and coupled to the lid assembly 110.

The pedestal heater 124 may include a heater plate 238 and a shaft 228. The heater plate 238 includes the heater electrode 125 and may include a substantially planar upper surface. In some embodiments, the heater plate 238 may be configured to support a planar substrate, such as a semiconductor wafer or the like. In some embodiments, the heater plate 238 may include a planar or substantially planar raised upper surface and a substantially planar ledge disposed radially outward of the raised upper surface. The pedestal heater 124 can have a diameter that is larger than the workpiece 158 to be coated. For example, the pedestal heater 124 can have a diameter that is larger than at least an inner diameter of the liner 157. In some embodiments, the pedestal heater 124 can have a diameter of about 500 to about 600 mm.

The lower body 108 is sized to define a first gap 258 between the pedestal heater 124 and interior volume 112 facing surfaces of the lower body 108. In some embodiments, the first gap 258 can be about 2 to about 4 mm, such as about 3 mm. A second gap 260 is formed between the upper surface of the bottom plate 182 and an opposing lower surface of the heater plate 238. In some embodiments, the second gap 260 can be about 3 to about 6 mm, such as about 4 mm. The opening 126 is larger than the outer diameter of the shaft 228 such that a third gap 262 is formed between the opening 126 and the shaft 228. In some embodiments, the third gap 262 can be about 3 to about 6 mm, such as about 4 mm.

The pedestal hub 128 is coupled to the lower body 108 about the shaft 228 and opening 126. The pedestal of 128 can be bolted or otherwise fastened to the lower body 108, for example, using a plurality of fasteners disposed through a corresponding plurality of openings 234 formed in a flange 232 of the pedestal hub 128 and extending into corresponding threaded openings of the lower body 108. In some embodiments, one or more grooves 251 may be provided in either or both of the pedestal hub 128 or the lower body 108 to facilitate forming a seal therebetween. For example, a gasket, such as in O-ring, may be disposed in the groove 251.

The pedestal hub 128 has an inner diameter that is larger than the outer diameter of the shaft 228. In some embodiments, the pedestal hub 128 has an inner diameter that is larger than that of the opening 126. In some embodiments, and as depicted in FIG. 2, a choke cup 230 may be provided to regulate the flow the exhaust of gases leaving the interior volume 112. The choke cup 230 can be disposed between the pedestal hub 128 and the lower body 108. The choke cup 230 provides flow conductance choke points to regulate the flow exiting the part coating reactor 102 to be more azimuthally uniform. For example, the choke cup 230 may be a tubular member including a flange 254 that may rest on a corresponding ledge 256 formed along the inner diameter of the pedestal hub 128. The flange 254 may have a thickness that is equal to or substantially equal to a height of the ledge 256 such that the flange 254 rests against the bottom of the lower body 108 when the pedestal hub 128 is coupled thereto.

The choke cup 230 may have an inner diameter that is substantially equal to the inner diameter of the opening 126 to define a fourth gap 264 between the inner surfaces of the choke cup 230 and the outer surface of the shaft 228. The choke cup 230 further has an outer diameter that is less than an inner diameter of the pedestal hub 128 such that a fifth gap 266 is defined therebetween. The choke cup 230 further includes a plurality of openings 231 formed therethrough to fluidly couple the fourth gap 264 to the fifth gap 266.

In some embodiments, one or more coolant channels 236 may be provided in the lower body 108 to flow a heat transfer medium therethrough. For example, the coolant source 142 can be coupled to the one or more coolant channels 236 to circulate a coolant therethrough. Alternatively, the one or more coolant channels 236 may be coupled to a different coolant source (not shown). In some embodiments, the coolant source 142 (or other different source) and coolant channels 236 are configured to maintain a temperature of the lower body 108 at about 50 to about 75 degrees Celsius. The small volume and configuration of the coolant channels 134, 236 advantageously facilitate rapid cooldown of the part coating reactor 102 to remove a finished workpiece and load a new workpiece to be coated, thus enhancing throughput.

In operation, when gases are flowing through the part coating reactor 102, the gases initially flow into the parts coating reactor 102 through the lid assembly 110. For example, gases can be introduced through at least one of the gas passages 136 or the central opening 121. The gases then flow through the blocker plate 215 to the workpiece. The gases then flow around the workpiece. In some embodiments, the workpiece is the workpiece 158, such as a showerhead, coupled to the lid assembly 110. In such embodiments, the gas flows across surfaces of the workpiece, such as an upper surface of the showerhead, through a plurality of gas distribution holes disposed through the showerhead, then between the face of the showerhead and across the pedestal heater 124. The gases then flow around peripheral edges of the pedestal heater 124 (e.g., through first gap 258), between the bottom of the pedestal heater 124 and the floor of the lower body 108 (e.g., through second gap 260), and are exhausted out of the interior volume 112 through a location beneath the pedestal heater 124, such through the choke cup 230 and pedestal hub 128 (e.g., through the third gap 262, fourth gap 264, and fifth gap 266 or sixth gap 602). A pump, such as the pump 150 is coupled to the interior volume 112, for example, through opening 606 in the pedestal hub 128.

FIG. 3 is a top isometric view of a lid assembly 110 in accordance with at least some embodiments of the present disclosure. The lid assembly 110 generally includes a body 310 comprising the top plate 178 and the sidewalls 180. In some embodiments, the body 310 includes one or more openings 304 on a sidewall of the body 310 configured for coupling a gas supply line to the body 310, for example, for coupling the first conduit 118 to the lid assembly 110. The body 310 may include a first annular heater groove 312 to retain the first heater ring 132A. The body 310 may include a second annular heater groove 314 disposed radially outward of the first annular heater groove 312 to retain the second heater ring 132B. In some embodiments, the body 310 includes an o-ring groove 318 disposed radially inward of the first heater ring 132A for coupling with the nozzle assembly 205.

In some embodiments, the lid assembly 110 includes a plurality of service openings 324 disposed between the outer annular plenum 208 and the plurality of vertical slots 316A configured for installing and removing the lid assembly 110 from the part coating reactor 102. In some embodiments, the body 310 includes a plurality of holes 308 for coupling the lid assembly 110 to the lower body 108. In some embodiments, the plurality of holes 308 are disposed in recesses 306 formed from an upper surface 350 of the body 302 so that fasteners do not protrude above the upper surface 350 of the body 302 when tightened.

Figure 4:
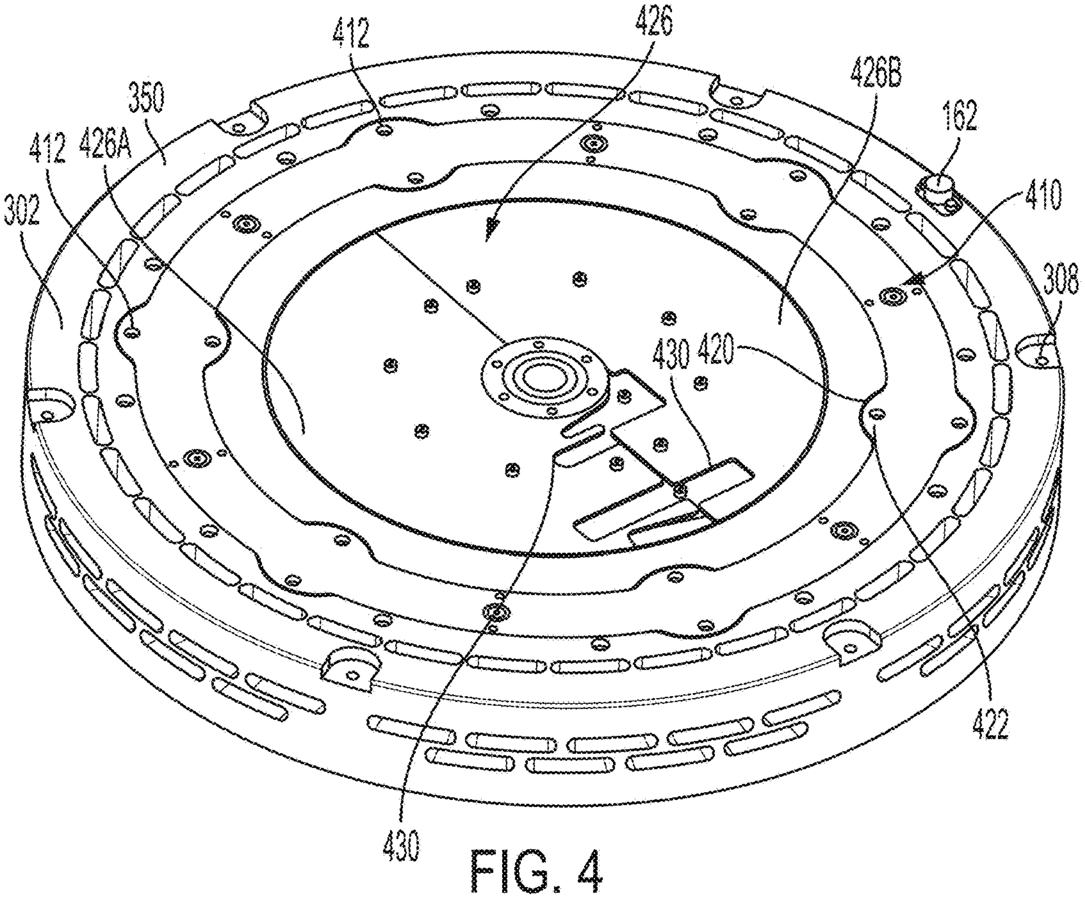
FIG. 4 is a top isometric view of a lid assembly in accordance with at least some embodiments of the present disclosure.

FIG. 4 is a top isometric view of a lid assembly with a cover plate in accordance with at least some embodiments of the present disclosure. In some embodiments, the cover plate 426 is disposed atop the first heater ring 132A and the second heater ring 132B. In some embodiments, the cover plate 426 is a circular plate. In some embodiments, the cover plate 426 has a two-piece construction comprising a first portion 426A and a second portion 426B. In such embodiments, the first portion 426A and the second portion 426B are substantially similar in size. In some embodiments, an interface between the first portion 426A and the second portion 426B is aligned with the central opening 121. In some embodiments, the cover plate 426 includes one or more cutouts 430 to facilitate power connections to the one or more heaters 132.

The cap 268 may be coupled to the body 310 via a plurality of fasteners 412. In some embodiments, a plurality of receptables 420 may be formed in the upper surface 350 of the lid assembly 110 to receive corresponding protrusions 422 from the cap 268. In some embodiments, the plurality of fasteners 412 are disposed at locations corresponding to the protrusions 422.

Figure 5:
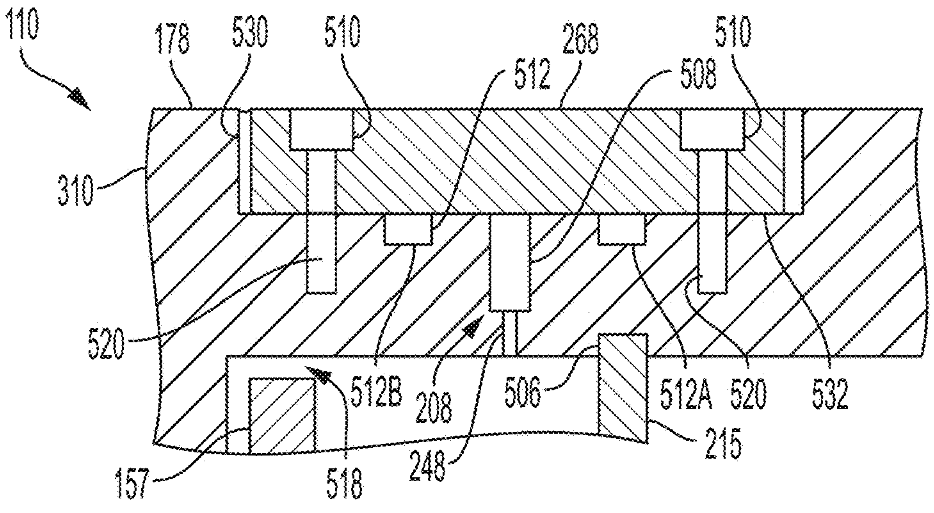
FIG. 5 is a top isometric view of a lid assembly with a cover plate in accordance with at least some embodiments of the present disclosure.

FIG. 5 is a cross-sectional view of a portion of a lid assembly in accordance with at least some embodiments of the present disclosure. The body 310 of the lid assembly 110 includes an annular recess 530 that extends from the upper surface of the body 310. An annular purge gas groove 508 extends from a floor 532 of the annular recess 530. The plurality of gas supply openings 248 extend from the annular purge gas groove 508 to a lower surface of the body 310. The annular purge gas groove 508 and the plurality of gas supply openings 248 generally define the outer annular plenum 208. The plurality of gas supply openings 248 fluidly couple the outer annular plenum 208 to the interior volume 112.

In some embodiments, a plurality of holes 510 may be formed through the cap 268 and aligned with corresponding holes 520 formed in the top plate 178 to receive fasteners to secure the cap 268 to the top plate 178. The cap 268 can be disposed within the annular recess 530 formed in the top plate 178 to cover the annular purge gas groove 508. The cap 268 may include one or more gas inlet holes (see one or more gas inlet holes 410 in FIG. 4). In some embodiments, the annular recess 530 and cap 268 may be sized such that the cap 268 is flush with, or does not protrude above, the top surface of the top plate 178. The outer annular plenum 208 can be coupled to the gas source 114, for example, via the first conduit 118. A gap 518 may be disposed between the liner 157 and the lower surface of the top plate 178. The gap 518 facilitates flow of gas around the liner 157 to the exhaust.

One or more o-ring grooves 512 may be formed in facing surfaces of at least one of the top plate 178 or the cap 268 to receive an o-ring to facilitate reducing or eliminating leaks from the outer annular plenum 208. For example, a first o-ring groove 512A of the one or more o-ring grooves 512 extends from the floor 532 radially inward of the annular purge gas groove 508. In some embodiments, a second o-ring groove 512B of the one or more o-ring grooves 512 extends from the floor 532 radially outward of the annular purge gas groove 508. In some embodiments, the lid assembly 110 includes an alignment groove 506 on a lower surface thereof to accommodate and align the blocker plate 215 with the lid assembly 110. In some embodiments, the alignment groove 506 is an annular groove.

Figure 6:
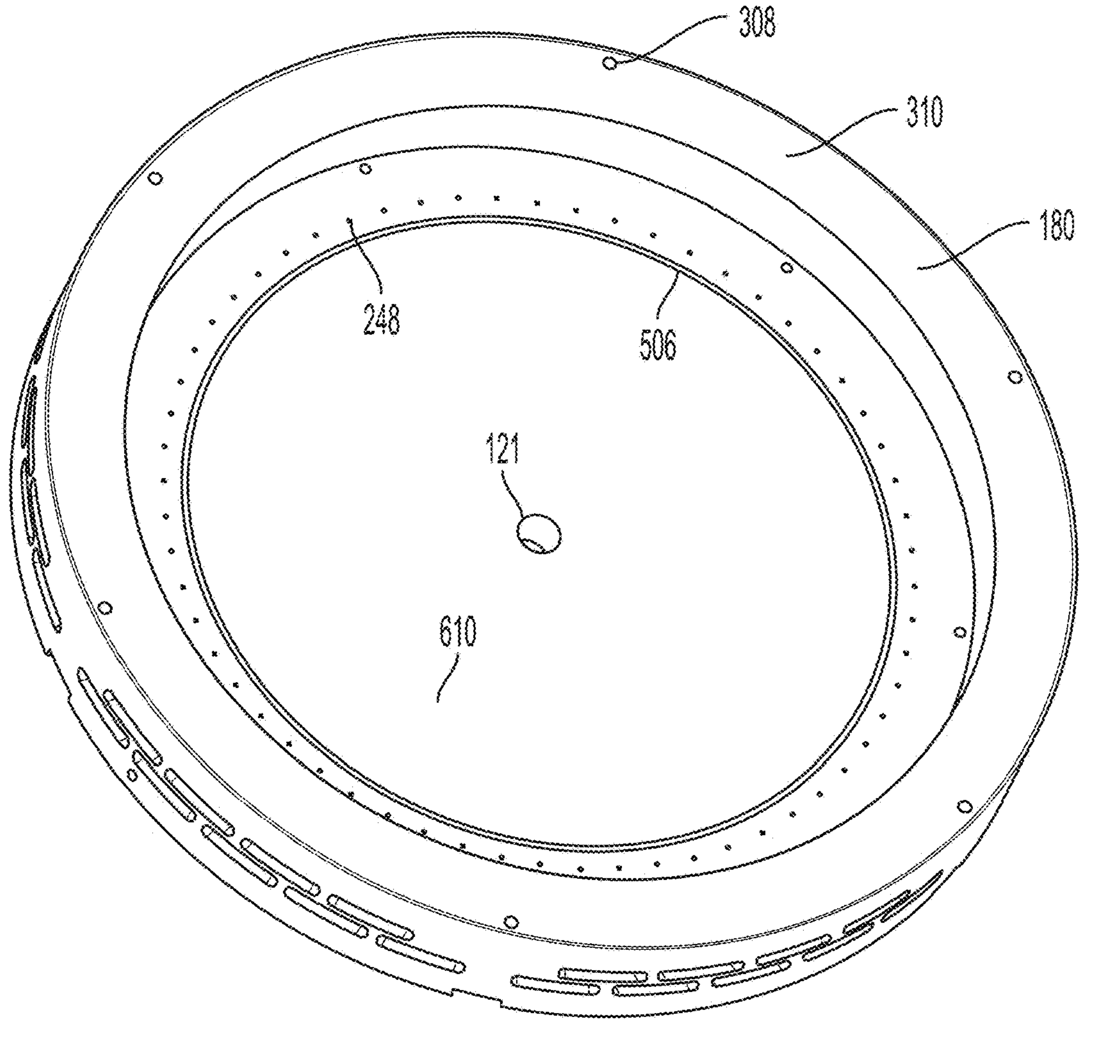
FIG. 6 is a bottom isometric view of a lid assembly in accordance with at least some embodiments of the present disclosure.

FIG. 6 is a bottom isometric view of a lid assembly in accordance with at least some embodiments of the present disclosure. In some embodiments, the alignment groove 506 for the blocker plate 215 is disposed radially inward of the plurality of gas supply openings 248. In some embodiments, the body 310 has no openings between the alignment groove 506 and the central opening 121. In some embodiments, a lower surface 610 of the top plate 178 disposed between the alignment groove 506 and the central opening 121 is substantially flat.

Figure 7:
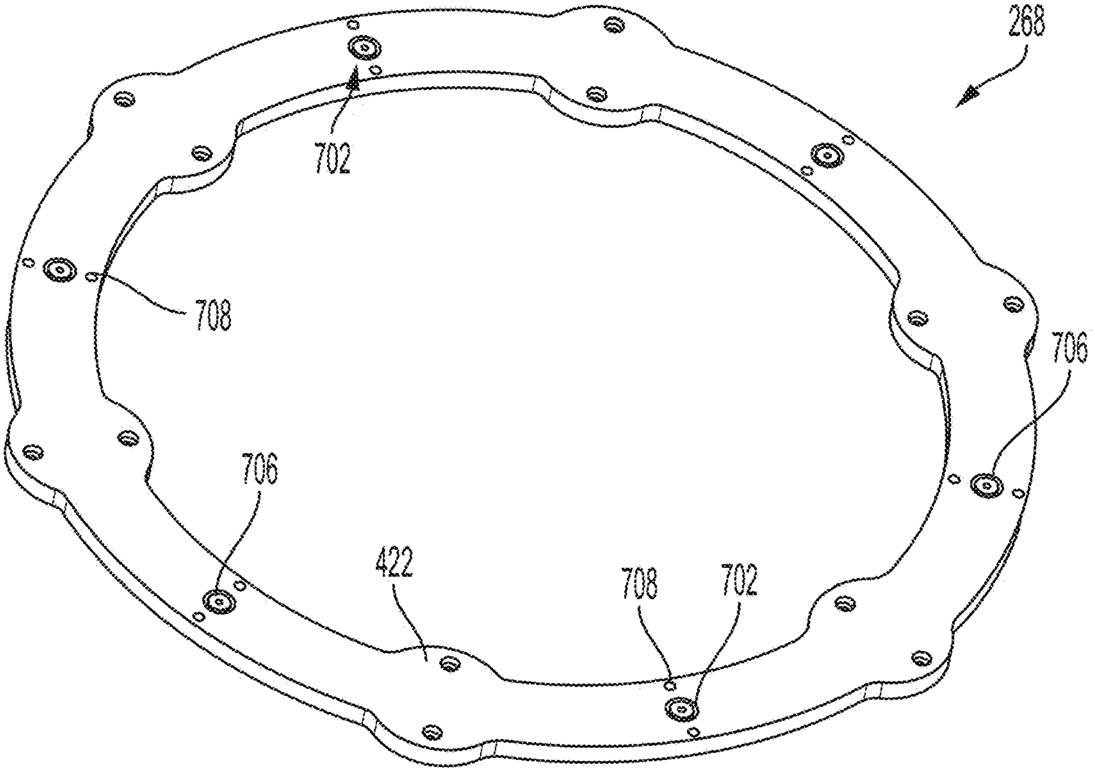
FIG. 7 is an isometric view of a cap in accordance with at least some embodiments of the present disclosure.

FIG. 7 is an isometric view of a cap 268 in accordance with at least some embodiments of the present disclosure. In some embodiments, the cap 268 includes one or more gas inlet holes 702. In some embodiments, an o-ring groove 706 is disposed about each of the one or more gas inlet holes 702.

The cap 268 may include fastener openings 708 proximate each of the one or more gas inlet holes 702 for coupling the one or more fittings 250 to each respective gas inlet hole. For example, the cap 268 may include fastener openings radially inward of, radially out of, or both radially inward of and radially outward of the one or more gas inlet holes 702. In other examples, the cap 268 may include fastener openings disposed at a substantially similar diameter as the one or more gas inlet holes 702.

Figure 8:
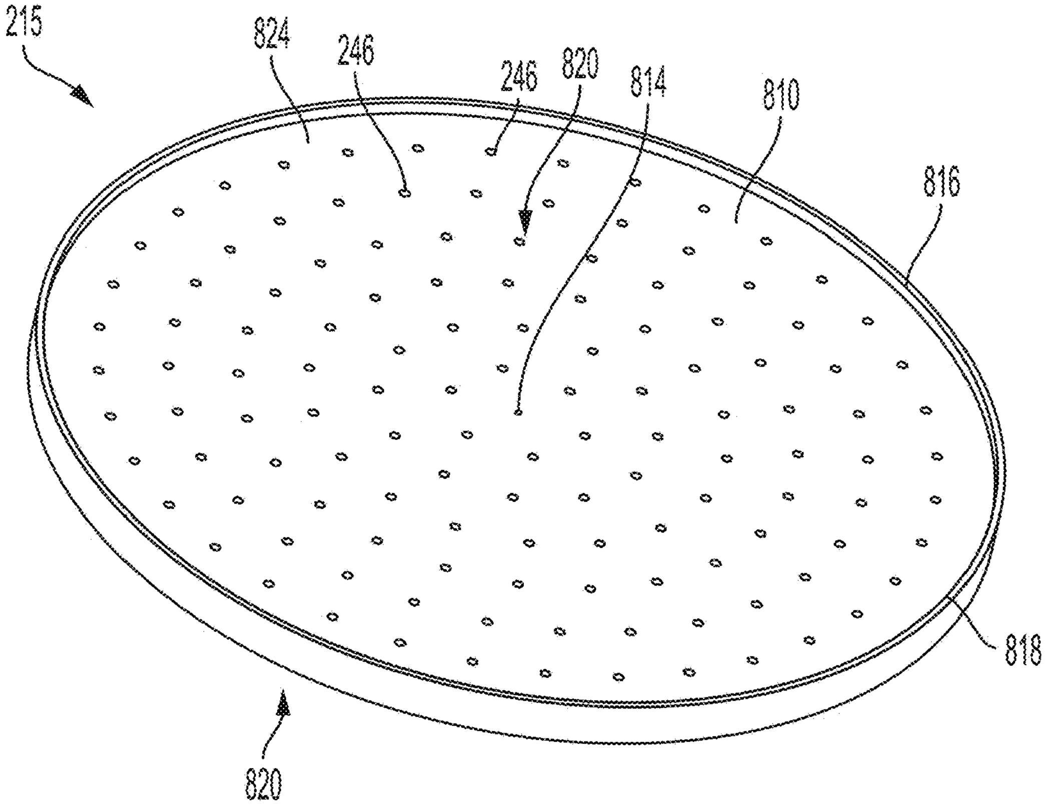
FIG. 8 is an isometric view of a blocker plate in accordance with at least some embodiments of the present disclosure.

FIG. 8 is an isometric view of a blocker plate in accordance with at least some embodiments of the present disclosure. The blocker plate 215 is configured to advantageously mix and distribute process gases in a more uniform manner for more uniform coating of the workpiece 158. In some embodiments, the blocker plate 215 includes a substantially flat plate 810 and an annular wall 816 extending above and below the flat plate 810. In some embodiments, the annular wall 816 surrounds the flat plate 810. In some embodiments, an upper surface 818 of the annular wall 816 is disposed in the alignment groove 506 of the lid assembly 110, when installed in the part coating reactor 102. In some embodiments, the plurality of holes 246 of the blocker plate 215 comprise a central hole 814 and a plurality of peripheral holes 820. In some embodiments, the central hole 814 has a diameter smaller than a diameter of the plurality of peripheral holes 820. In some embodiments, the plurality of holes 812 increase in diameter from an upper surface 824 of the blocker plate 215 to a lower surface of the blocker plate 215. In some embodiments, the central hole 814 has a diameter of about 1 to about 4 mm. In some embodiments, the plurality of holes 246 consist of more than 50 holes. In some embodiments, the plurality of holes 246 consist of more than 100 holes.

Figure 9:
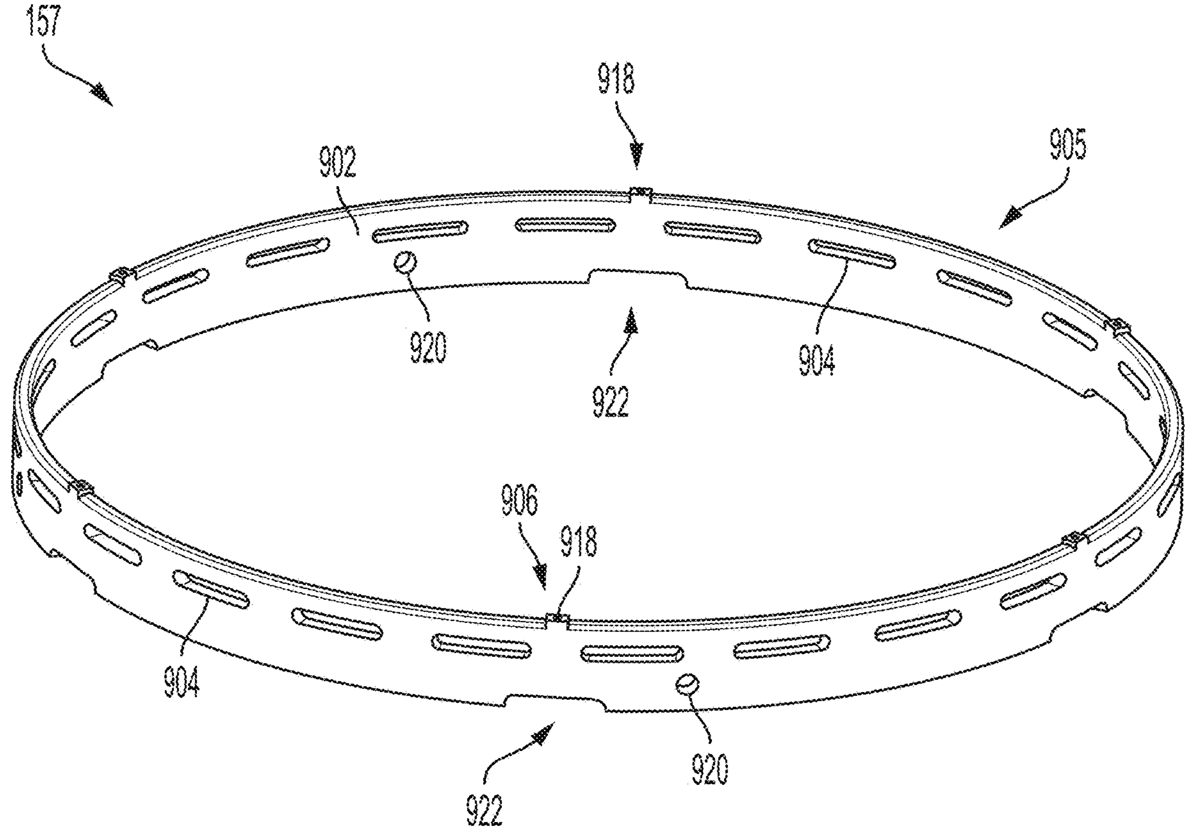
FIG. 9 is an isometric view of an outer liner in accordance with at least some embodiments of the present disclosure.

FIG. 9 is an isometric view of a liner in accordance with at least some embodiments of the present disclosure. In some embodiments, and as depicted in FIG. 9, the liner 157 can have an annular body 902. The liner 157 can be fabricated from any process compatible materials, such as aluminum. The liner 157 includes a plurality of openings 920 configured to receive a fastener, such as a set screw, a grub screw, or the like, to secure the liner 157 to the workpiece 158, and therefore to secure the workpiece 158 to the lid assembly 110.

In some embodiments, an upper surface of the liner 157 includes a plurality of raised portions 906 (e.g., protrusions) that provide a stand-off for the liner 157 such that a gap (e.g., gap 518 depicted in FIG. 5) is defined between the upper surface 905 of the annular body 902 and the lower surface of the top plate 178 of the lid assembly 110. The gap facilitates flow of gas around the liner 157 to the exhaust. An opening 918 may extend through sidewalls of the annular body 902 and each of the raised portions 906 to facilitate coupling the liner 157 to the lid assembly 110. A recessed portion 922 may be provided opposite each raised portion 906, for example, to facilitate receiving a head of a fastener passing through the respective opening 918 in the annular body 902. The liner 157 may include a plurality of through holes 904 formed through the sidewall of the annular body to further facilitate flow of gas around the liner 157 to the exhaust. The plurality of through holes 904 may be elongated openings having a width of about 4 to about 6 mm.

While the foregoing is directed to embodiments of the present disclosure, other and further embodiments of the disclosure may be devised without departing from the basic scope thereof.

The invention claimed is:

1. A part coating reactor, comprising:

a lid assembly, comprising:

a body that includes a central region and a peripheral region, wherein the body includes a central opening in the central region, a first annular heater groove disposed radially outward of the central opening, and a second annular heater groove disposed radially outward of the first annular heater groove, wherein the peripheral region includes a plurality of vertical slots that extend from an upper surface of the body, wherein the body includes an annular recess that extends from the upper surface of the body, an annular purge gas groove that extends from a floor of the annular recess, and a plurality of gas supply openings extending from the purge gas groove to a lower surface of the body, and wherein a lower surface of the body includes an annular alignment groove;

a first heater ring disposed in the first annular heater groove and having one or more heating elements disposed therein; and a second heater ring disposed in the second annular heater groove and having one or more heating elements disposed therein; and a blocker plate including a substantially flat plate having a plurality of holes disposed therethrough and an annular wall extending above and below the flat plate, wherein an upper surface of the annular wall is disposed in the annular alignment groove of the body.

2. The part coating reactor of claim 1, wherein the plurality of holes of the blocker plate comprise a central hole and a plurality of peripheral holes, wherein the central hole has a diameter smaller than a diameter of the plurality of peripheral holes.

3. The part coating reactor of claim 1, wherein the alignment groove is disposed radially inward of the plurality of gas supply openings.

4. The part coating reactor of claim 1, wherein the body includes a plurality of horizontal slots arranged along two or more vertical rows and extending from an outer sidewall of the body to a location radially outward of the plurality of vertical slots.

5. The part coating reactor of claim 1, further comprising a cap disposed in the annular recess to cover the annular purge gas groove, wherein the cap includes one or more gas inlet holes.

6. The part coating reactor of claim 1, wherein the body includes one or more openings on a sidewall of the body configured for coupling a gas supply line to the body.

7. The part coating reactor of claim 1, further comprising a cover plate disposed atop the first heater ring and the second heater ring, wherein the cover plate is a circular plate.

8. The part coating reactor of claim 1, wherein the lid assembly includes a plurality of service openings disposed between the annular recess and the plurality of vertical slots configured for installing and removing the lid assembly from the part coating reactor.

9. A part coating reactor, comprising:

a lid assembly having a body that includes a central region and a peripheral region, wherein the body includes a central opening in the central region, a first heater ring disposed in a first annular heater groove disposed radially outward of the central opening, and a second heater ring disposed in a second annular heater groove disposed radially outward of the first annular heater groove, wherein the peripheral region includes a plurality of vertical slots that extend from an upper surface of the body, wherein the body includes an annular gas supply groove that extends from the upper surface of the body, an annular purge gas groove that extends from a floor of the annular gas supply groove, and a plurality of gas supply openings extending from the purge gas groove to a lower surface of the body;

a cap disposed in the annular gas supply groove to define a first plenum in the annular gas supply groove, wherein the cap includes one or more gas inlet holes;

a bottom lid coupled to the lid assembly to enclose and define an interior volume of the part coating reactor;

a blocker plate disposed in the interior volume adjacent the lid assembly and including a substantially flat plate having a plurality of holes disposed therethrough and an annular wall extending above and below the flat plate, wherein the blocker plate and the lid assembly define a mixing plenum therebetween; and a liner disposed about the blocker plate and coupled to the body.

10. The part coating reactor of claim 9, further comprising a pedestal heater disposed in the interior volume opposite the blocker plate.

11. The part coating reactor of claim 9, wherein the liner includes a plurality of slots and a plurality of openings for coupling the liner to a workpiece.

12. The part coating reactor of claim 9, wherein the cap includes an o-ring groove disposed about each of the one or more gas inlet holes.

13. The part coating reactor of claim 9, wherein the plurality of holes of the blocker plate increase in diameter from an upper surface of the blocker plate to a lower surface of the blocker plate.

14. The part coating reactor of claim 9, wherein the body further comprises a first o-ring groove extending from the floor of the annular gas supply groove radially inward of the annular purge gas groove, and a second o-ring groove extending from the floor of the annular gas supply groove radially outward of the annular purge gas groove.

15. A process chamber, comprising:

a lid assembly having a body that includes a central region and a peripheral region, wherein the body includes a central opening in the central region, a first heater ring disposed in a first annular heater groove disposed radially outward of the central opening, and a second heater ring disposed in a second annular heater groove disposed radially outward of the first annular heater groove, wherein the peripheral region includes a plurality of vertical slots that extend from an upper surface of the body, wherein the body includes an annular gas supply groove that extends from the upper surface of the body, an annular purge gas groove that extends from a floor of the annular gas supply groove, and a plurality of gas supply openings extending from the purge gas groove to a lower surface of the body;

a cap disposed in the annular gas supply groove to cover the annular purge gas groove, wherein the cap includes one or more gas inlet holes;

a cover plate disposed atop the first heater ring and the second heater ring;

a bottom lid coupled to the lid assembly to enclose and define an interior volume of the process chamber;

a blocker plate disposed in the interior volume adjacent the lid assembly and including a substantially flat plate having a plurality of holes disposed therethrough and an annular wall extending above and below the flat plate, wherein the blocker plate and the lid assembly define a mixing plenum therebetween;

a liner disposed about the blocker plate and coupled to the lid assembly, the liner having a plurality slots; and a pedestal heater disposed in the interior volume.

16. The process chamber of claim 15, wherein a purge gas source is coupled to the annular purge gas groove.

17. The process chamber of claim 15, further comprising a gas source coupled to the central opening of the body.

18. The process chamber of claim 15, wherein the body includes a plurality of horizontal slots extending from an outer sidewall of the body to a location radially outward of the plurality of vertical slots.

19. The process chamber of claim 15, wherein the blocker plate is held between the lid assembly and a workpiece being processed in the process chamber.

20. The process chamber of claim 15, further comprising a remote plasma source coupled to the central opening of the lid assembly.

* * * * *